US012685183B2

(12) United States Patent
Umemura et al.

(10) Patent No.: US 12,685,183 B2
(45) Date of Patent: Jul. 14, 2026

(54) METHOD FOR MANUFACTURING WIRING BOARD

(71) Applicant: TOPPAN INC., Tokyo (JP)

(72) Inventors: Yuki Umemura, Tokyo (JP); Takehisa Takada, Tokyo (JP); Tomoyuki Ishii, Tokyo (JP)

(73) Assignee: TOPPAN INC., Tokyo (JP)

( * ) Notice: Subject to any disclaimer, the term of this patent is extended or adjusted under 35 U.S.C. 154(b) by 163 days.

(21) Appl. No.: 18/371,256

(22) Filed: Sep. 21, 2023

(65) Prior Publication Data

US 2024/0014047 A1    Jan. 11, 2024

Related U.S. Application Data

(63) Continuation of application No. PCT/JP2022/011537, filed on Mar. 15, 2022.

(30) Foreign Application Priority Data

Mar. 26, 2021    (JP) ................................. 2021-052646

(51) Int. Cl.
*H10W 70/05*          (2026.01)
*H05K 1/02*           (2006.01)
(Continued)

(52) U.S. Cl.
CPC ........ *H10W 70/095* (2026.01); *H05K 1/0266* (2013.01); *H05K 1/0306* (2013.01);
(Continued)

(58) Field of Classification Search
CPC ....... H01G 2/06; H01L 21/481; H01L 21/486; H01L 2223/54426; H01L 23/15;
(Continued)

(56) References Cited

U.S. PATENT DOCUMENTS 7,855,458 B2    12/2010  Matsumoto et al.
2014/0035935 A1    2/2014  Shenoy et al.
(Continued)

FOREIGN PATENT DOCUMENTS

CN        112312654 A        2/2021
JP          4916715 B2        4/2012
(Continued)

OTHER PUBLICATIONS

Office Action issued in corresponding Japanese Patent Application No. 2021-052646 dated Feb. 18, 2025.
(Continued)

*Primary Examiner* — Minh N Trinh
(74) *Attorney, Agent, or Firm* — Foley & Lardner LLP

(57)          ABSTRACT

A method for manufacturing a wiring board, including a step A of forming a laser-modified portion in a glass substrate by applying laser light to the glass substrate from a first surface to an opposite surface of the glass substrate; a step B of forming a first surface wiring layer including a MIM capacitor on the first surface of the glass substrate; a step C of performing an etching process on a surface of the glass substrate opposite to the first surface to form a through via in the laser-modified portion and form a second surface of the glass substrate opposite to the first surface; and a step D of forming a through electrode in the through via and forming, on the second surface, a second surface wiring layer that is connected to the first surface wiring layer via the through electrode.

4 Claims, 6 Drawing Sheets

(51) Int. Cl.

| | |
|---|---|
| *H05K 1/03* | (2006.01) |
| *H05K 1/11* | (2006.01) |
| *H05K 1/181* | (2026.01) |
| *H05K 3/00* | (2006.01) |
| *H05K 3/40* | (2006.01) |
| *H10D 1/68* | (2025.01) |
| *H10W 46/00* | (2026.01) |
| *H10W 70/63* | (2026.01) |
| *H10W 70/685* | (2026.01) |

(52) U.S. Cl.
   CPC ............. *H05K 1/115* (2013.01); *H05K 1/181* (2013.01); *H05K 3/0026* (2013.01); *H05K 3/4038* (2013.01); *H10D 1/68* (2025.01); *H10W 46/00* (2026.01); *H10W 70/635* (2026.01); *H10W 70/685* (2026.01); *H05K 2203/107* (2013.01); *H10W 46/301* (2026.01)

(58) Field of Classification Search
   CPC ......... H01L 23/49816; H01L 23/49822; H01L 23/49827; H01L 23/544
   USPC .................................................. 29/830–832
   See application file for complete search history.

(56) References Cited

U.S. PATENT DOCUMENTS

| | | | |
|---|---|---|---|
| 2021/0118698 A1 | 4/2021 | Sawadaishi | |
| 2022/0053644 A1* | 2/2022 | Chen ..................... | H05K 1/162 |
| 2024/0014047 A1* | 1/2024 | Umemura ............ | H05K 1/0306 |

FOREIGN PATENT DOCUMENTS

| | | |
|---|---|---|
| JP | 2018-074134 A | 5/2018 |
| JP | 2018-107419 A | 7/2018 |
| WO | WO-2019/235617 A1 | 12/2019 |

OTHER PUBLICATIONS

International Searching Authority, "International Search Report," issued in connection with International Patent Application No. PCT/JP2022/011537, dated Jun. 14, 2022.

International Searching Authority, "Written Opinion," issued in connection with International Patent Application No. PCT/JP2022/011537, dated Jun. 14, 2022.

* cited by examiner

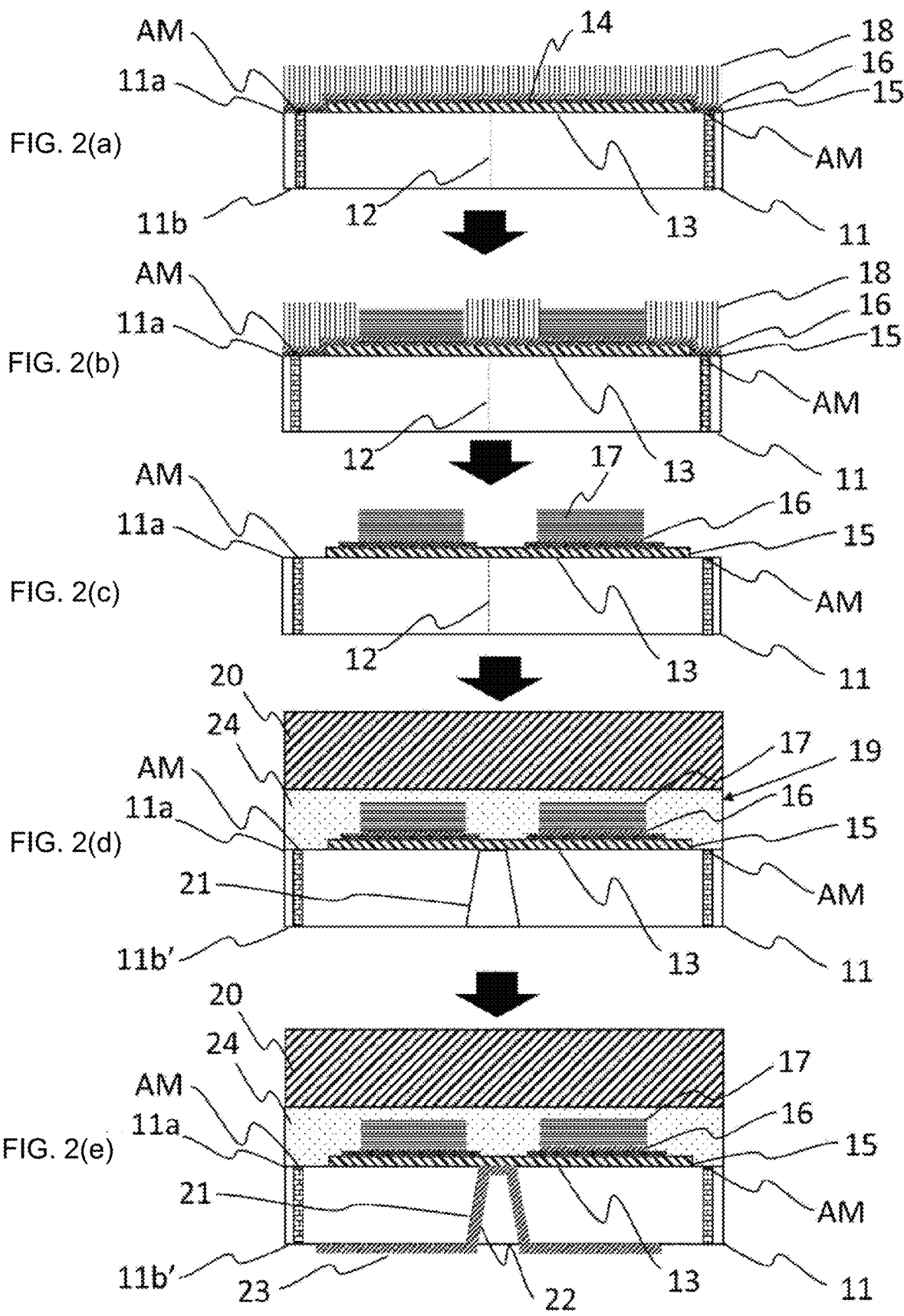

METHOD FOR MANUFACTURING WIRING BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2022/011537, filed on Mar. 15, 2022, which is based upon and claims the benefit of priority to Japanese Patent Application No. 2021-052646, filed on Mar. 26, 2021; the disclosures of which are incorporated herein by reference in their entirety.

TECHNICAL FIELD

The present invention relates to methods for manufacturing wiring boards, and wiring boards.

BACKGROUND

The demand for higher-density wiring boards to be included in semiconductor devices is growing as electronic devices increase in functionality and decrease in size. Under this circumstance, along with more refined circuit wiring, there is also a demand for further miniaturization of passive components, such as resistors, capacitors and inductors. Further miniaturization is very demanding, and only miniaturization of these passive components and high-density packaging of these components on board surfaces may not be sufficient to keep up with the demand.

Examples of effective techniques for higher-density wiring boards include forming, on circuit boards, parallel-plate capacitors having a MIM (metal-insulator-metal) structure, as illustrated in Patent Literature (PTL) 1. A MIM structure refers to a structure in which thin films of a metal and a dielectric are laminated alternately. A capacitor having the MIM structure (hereinafter referred to as a MIM capacitor) is characterized by not only having a thin structure, but also having low parasitic inductance and low equivalent series resistance as compared to a capacitor as a discrete component. Therefore, the MIM capacitor has the advantages of being able to maintain power supply stabilization performance at a high level and provide a high-density, but accurate LC circuit, for example.

Meanwhile, organic materials such as a glass epoxy resin are typically used as materials for substrates, but in recent years, with the advancement of the glass drilling technology, for example, through-holes each having a small diameter of 100 μm or less can be formed in 300 μm-thick glass with a pitch of 150 μm or less. Therefore, electronic circuit boards formed using glass materials have gained attention. A circuit board with a glass material as its core (hereinafter referred to as a glass circuit board) includes glass with a coefficient of linear thermal expansion (CTE) as small as 2 ppm to 8 ppm, which matches silicon chips, resulting in higher packaging reliability and furthermore, enabling accurate packaging due to a high degree of flatness.

In addition, due to having a high degree of flatness, glass has good formability for fine wiring and exhibits good high-speed transmission characteristics as well, for example. Furthermore, research has been conducted in the use of glass for electronic circuit boards taking advantage of the features of glass, i.e., transparency, chemical stability, high elasticity, and inexpensiveness; and it is expected to be commercialized, for example, as interposers for semiconductor devices, circuit boards for imaging devices, and LC duplexers (diplexers) for communication devices. Such electronic circuits including glass cores are required to be provided with decoupling capacitors, LC circuits, or the like, and therefore, the demand for embedding capacitors into such electronic circuits is growing.

Patent Literature 2 discloses the technique of forming a through via in a glass substrate and then forming a MIM capacitor near the through via.

CITATION LIST

Patent Literature

PTL 1: JP 4916715 B; PTL 2: JP 2018-074134 A.

SUMMARY OF THE INVENTION

Technical Problem

However, the results of study by the inventors of the present invention show that when the MIM capacitor is formed near the through via formed in the substrate, the performance of the capacitor may be degraded. The reason for this will be described below.

FIGS. 1(a)-1(d) are a set of diagrams illustrating parts of the process for forming a MIM capacitor near a through via according to a related art. Hereinafter, a manufacturing process according to the related art will be described.

First, a through via 2 is formed in a substrate 1, and a conductive layer 3 is formed on both sides of the substrate 1 and in the through via 2. Next, on one side of the substrate 1, a dielectric layer 4 and a sputtered seed layer 5 are formed on the conductive layer 3 and furthermore, both sides of the substrate 1 are laminated with dry film resists 6.

A portion of the dry film resists 6 after the lamination enters the through via 2, as illustrated in FIG. 1(a); however, at this time, air in the through via 2 may move to the front surface side of the substrate 1. This may lead to a phenomenon in which the air remains as air bubbles BB on the lower surface of the dry film resist 6 or a surface of the dry film resist 6 becomes uneven, for example, and subsequent patterning may cause the dry film resist 6 to deform and have defects MS in parts thereof, as illustrated in FIG. 1(b).

When plating is performed on the substrate 1 having the dry film resist 6 with such a defect MS, a precipitate is produced at the position of the defect in the dry film resist 6, as illustrated in FIG. 1(c). Subsequently, the dry film resist 6 is removed, resulting in an upper electrode 7 formed of the produced precipitate having a shape different from a design shape, as illustrated in FIG. 1(d). The MIM capacitor formed of these upper electrode 7, dielectric layer 4, and conductive layer 3 may not be able to provide the capacitance that has been designed.

The present invention has been conceived in view of the aforementioned problems and has an object to provide: a method for manufacturing a wiring board in which an accurate MIM capacitor is formed on a glass substrate; and the wiring board.

Solution to Problem

In order to solve the aforementioned problems, one typical method for manufacturing a wiring board according to the present invention is achieved by including:

a step A of forming a laser-modified portion in a glass substrate by applying laser light to the glass substrate from a first surface to an opposite surface of the glass substrate;

a step B of forming a MIM capacitor on the first surface of the glass substrate;

a step C of performing an etching process on a surface of the glass substrate opposite to the first surface to form a through via in the laser-modified portion and form a second surface of the glass substrate opposite to the first surface; and a step D of forming a through electrode in the through via and forming, on the second surface, a second surface wiring layer that is connected to the first surface wiring layer via the through electrode.

Furthermore, a typical wiring board according to the present invention is achieved by including:

a first surface wiring layer including a MIM capacitor formed on a first surface of a glass substrate;

a second surface wiring layer formed on a second surface of the glass substrate opposite to the first surface;

a through via connecting the first surface and the second surface; and a through electrode formed in the through via and connecting the first surface wiring layer and the second surface wiring layer, wherein the through via decreases in diameter from the second surface toward the first surface.

Advantageous Effects of the Invention

With the present invention, it is possible to provide: a method for manufacturing a wiring board in which an accurate MIM capacitor is formed on a glass substrate; and the wiring board.

Problems, configurations, and advantageous effects other than those described above will be made clear by the following description of embodiments.

BRIEF DESCRIPTION OF THE DRAWINGS

FIGS. 2($a$)-2($e$) are a set of diagrams illustrating steps in a method for manufacturing a wiring board according to a present embodiment.

FIG. 4($b$) is a plan view illustrating an example where a MIM capacitor and a through via have been formed on the glass substrate in this order.

DETAILED DESCRIPTION

Figures 1A, 1B, 1C, 1D:
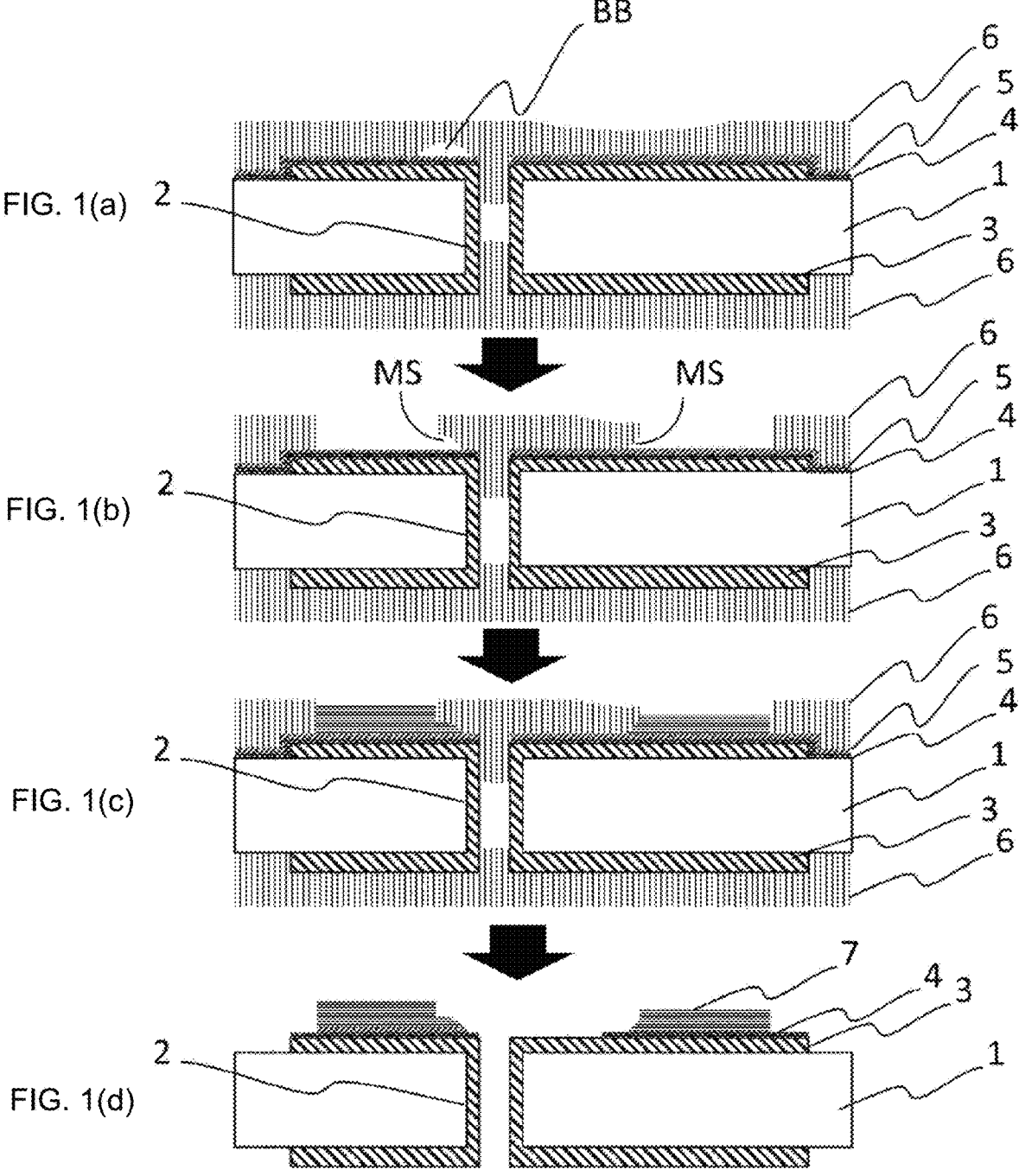
FIGS. 1($a$)-1($d$) are a set of diagrams illustrating parts of the process for forming a MIM capacitor near a through via according to a related art.

Note that in the present disclosure, the term "surface" may refer to not only a surface of a plate-shaped member, but also an interface of a layer included in a plate-shaped member such that the interface is substantially parallel to a surface of the plate-shaped member. The terms "upper surface" and "lower surface" refer to surfaces illustrated in upper and lower areas of a drawing when a plate-shaped member, a layer included in a plate-shaped member, or the like is illustrated in the drawings.

With reference to the drawings, some embodiments of the present invention will be described. Note that the present invention is not limited to these embodiments. In the description of the drawings, the same parts are denoted by the same reference signs.

FIGS. 2($a$)-2($e$) are a set of diagrams illustrating steps in a method for manufacturing a wiring board according to a present embodiment. Hereinafter, the method for manufacturing the wiring board according to the present embodiment will be described.

(Step 1)

Alkali-free glass having a thickness of 500 μm is prepared, foreign matter on surfaces of the alkali-free glass is removed by ultrasonic cleaning or the like, and thus a glass substrate 11 is provided. Subsequently, laser light is emitted from the first surface 11$a$-side area to the glass substrate 11, and a laser-modified portion 12, which is a starting point of a through via, is formed. The laser-modified portion 12 is formed so as to extend downward, for example, perpendicularly, from a first surface 11$a$, and have a lower end within the glass substrate 11.

Note that in the present embodiment, the step of forming the laser-modified portion by emitting the laser light from one surface to the other surface of the glass substrate is referred to as a step A. The step A corresponds to Step 1 described above, but the disclosure of Step 1 does not limit the step A.

At this time, the laser light with intensity increased by changing the output of the laser, for example, is emitted to the first surface 11$a$ so that the glass has a part of its surface deformed into the shape of a recess or a protrusion, and thus a visible alignment mark AM is formed. By forming the alignment mark AM in the same step as the step of forming the laser-modified portion 12, the number of processes can be reduced.

(Step 2)

Next, a hydrofluoric acid resistant metal film 13 having a thickness in the range of 10 nm or more and 500 nm or less is formed on the first surface 11$a$ of the glass substrate 11 by sputtering or the like. Subsequently, a copper film 14 having a thickness in the range of 100 nm or more and 500 nm or less is formed by sputtering, electroless plating, or the like on the hydrofluoric acid resistant metal film 13. Thus, a seed layer is formed on the first surface 11$a$ of the glass substrate 11. The material of the hydrofluoric acid resistant metal film 13 is selected, for example, from chromium, nickel, and nickel-chromium, as appropriate.

(Step 3)

Next, a photoresist of a pattern is formed. Specifically, the first surface 11a-side area is laminated with a dry photoresist (under the product name RD1225) produced by Showa Denko Materials Co., Ltd., positioning is performed using the alignment mark AM, for example, the pattern is drawn, then development is performed, and thus the seed layer is exposed. Furthermore, electric power is supplied to the seed layer, electrolytic copper plating is performed to form a copper layer having a thickness of 2 μm or more and 10 μm or less, and thus a lower electrode 15 is formed. After the plating, the dry film resist that is no longer needed is dissolved away. The use of the alignment mark AM allows accurate positioning of the lower electrode 15.

(Step 4)

Next, a dielectric film 16 is formed on the lower electrode 15. Examples of the method for forming the dielectric film 16 include, but are not limited to, forming SiN, $SiO_2$, TaOx, or the like by plasma chemical vapor deposition (CVD).

(Step 5)

Next, an upper electrode 17 is formed on the dielectric film 16. A copper film (Cu, Ti/Cu) or the like having a thickness in the range of 100 nm or more and 500 nm or less is formed on the dielectric film 16 by sputtering, electroless plating, or the like, and the first surface 11a-side area is laminated with a dry photoresist 18, as illustrated in FIG. 2(a).

Subsequently, positioning is performed using the alignment mark AM, for example, a pattern is drawn, and development is performed, thus a seed layer is exposed, electric power is supplied to the seed layer, and electroless copper plating is performed to form a copper layer having a thickness of 2 μm or more and 10 μm or less, as illustrated in FIG. 2(b).

At this time, no through via has been formed in the glass substrate 11 and therefore, unlike the related art, air does not remain on the lower surface of the dry photoresist 18 during the lamination with the dry photoresist 18, allowing for an accurate shape in the plating followed by the patterning.

Furthermore, after the plating, the dry film resist 18 that is no longer needed is dissolved away, and a first surface wiring layer 19 including a MIM capacitor is formed, as illustrated in FIG. 2(c). At this time, an etching process is performed on the upper electrode 17, the dielectric film 16, the lower electrode 15, and the hydrofluoric acid resistant metal film 13.

Figure 3:
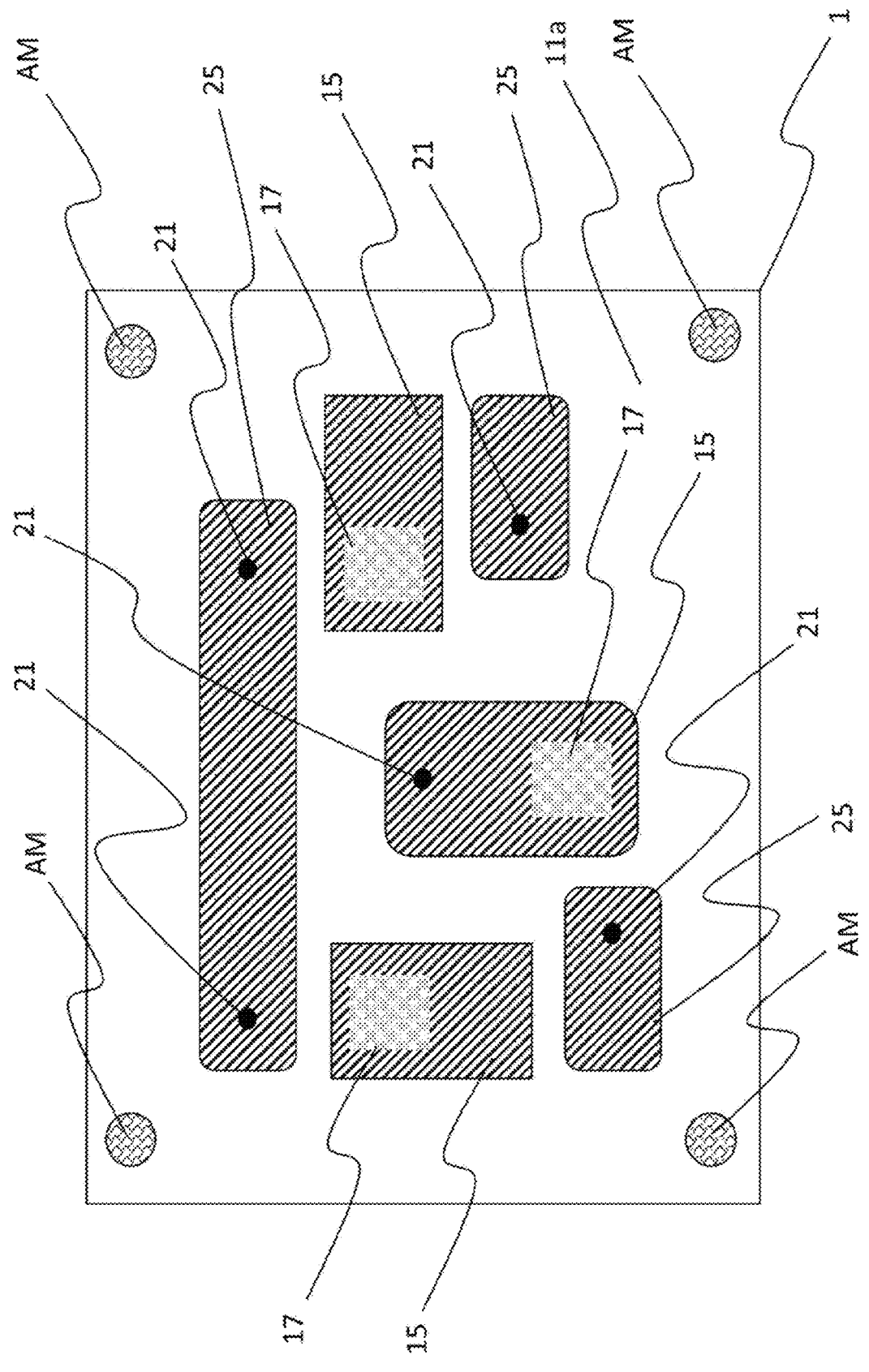
FIG. 3 is a plan view illustrating an example of a first surface of a glass substrate on which a first surface wiring layer has been formed.

FIG. 3 illustrates, as a plan view, an example of the first surface 11a of the glass substrate 11 on which the first surface wiring layer 19 has been formed. In addition to the upper electrode 17, a copper layer 25 for wiring is formed above the first surface 11a.

Note that in the present embodiment, the step of forming the first surface wiring layer including the MIM capacitor on the first surface of the glass substrate is referred to as a step B. The step B corresponds to Steps 3 to 5 described above, but the disclosure of Steps 3 to 5 does not limit the step B. Note that the step A may be performed after the step B. In this case, the laser light is emitted from the surface 11b side of the glass substrate 11.

Here, Cu can be removed by a wet etching process, the dielectric can be removed by a dry etching process, and Ti can be removed by a dry etching process or a wet etching process. Furthermore, the hydrofluoric acid resistant metal film 13 can also be removed by a wet etching process appropriate for a metal film. The upper electrode 17, the dielectric film 16, and the lower electrode 15 form the MIM capacitor.

(Step 7)

Next, the first surface wiring layer 19 is laminated with a 32.5 μm-thick layer of an insulating resin 24 (under the product name ABF-GXT31) produced by Ajinomoto Fine-Techno Co., Inc.

(Step 8)

Next, a glass carrier 20 is bonded onto the insulating resin 24. Specifically, the glass carrier 20 is bonded onto the first surface wiring layer 19 using an adhesive for temporary bonding (under the product name REVALPHA produced by Nitto Denko Corporation). The glass carrier 20 desirably has a thickness in the range of 0.7 mm or more and 1.5 mm or less in view of the transportability thereof after being reduced in thickness. The thickness of the glass carrier 20 may be set, as appropriate, according to the thickness of the glass substrate 11. The glass carrier is illustrated as a support, but the support is not required to be made of glass and may be made of a metal, a resin, or the like.

(Step 9)

Next, using a hydrogen fluoride solution, an etching process is performed from a surface 11b of the glass substrate 11, which is opposite to the first surface 11a. The glass in the area where the laser-modified portion 12 has not been formed is subjected to the etching process using the hydrogen fluoride solution, and the thickness thereof is reduced while the processed glass substrate 1 has a surface opposite which remains parallel with the first surface 11a, as illustrated in FIG. 2(d); thus, the thickness and size of the wiring board can be reduced. The use of the hydrogen fluoride solution in the etching process allows for reduction in damage to the MIM capacitor during machining.

Note that in the present embodiment, the step of etching the surface of the glass substrate opposite to the first surface to form the through via in the laser-modified portion and form the second surface of the glass substrate opposite to the first surface is referred to as a step C. The step C corresponds to Step 9 described above, but the disclosure of Step 9 does not limit the step C.

When the hydrogen fluoride solution comes into contact with the laser-modified portion 12, the laser-modified portion 12 is dissolved preferentially, and thus a through via 21 having a frustoconical shape is formed. In this manner, the glass substrate 11 is reduced in thickness while the through via 21 is formed therein. In other words, since the reduction in thickness and the formation of the through via 21 are included in one etching process, the impact on the MIM capacitor can be minimized. The lower surface of the glass substrate 11 that has been reduced in thickness is a second surface 11b'. The through via 21 has a frustoconical shape with a diameter (or a cross-sectional area) on the second surface 11b' side greater than a diameter (or a cross-sectional area) on the first surface 11a side. The diameter of the through via 21 on the second surface 11b' side is preferably 1.2 times or more and 4.0 times or less the diameter thereof on the first surface 11a side. This multiplication factor can be changed by adjusting the depth of the laser-modified portion 12.

The amount to be etched away by the hydrogen fluoride solution may be set, as appropriate, according to the final thickness of the glass device. For example, when the glass substrate 11 used in Step 1 has a thickness of 400 μm, the amount to be etched away is desirably in the range of 100 μm or more and 350 μm or less. The glass substrate 11 reduced in thickness preferably has a thickness of 50 μm or more and 300 μm or less.

(Step 10)

Next, as illustrated in FIG. 2(e), a copper film or an equivalent thereof having a thickness in the range of 100 nm or more and 500 nm or less is formed on the second surface 11b' of the glass substrate 11, as well as the inside of the through via 21, by sputtering, electroless plating, or the like. Thus, a seed layer is formed on the second surface 11b' side of the glass substrate 11.

(Step 11)

Next, similarly to Step 3, a pattern is formed using a dry film resist, electric power is supplied to the seed layer, electrolytic plating is performed to form a layer having a thickness of 2 μm or more and 10 μm or less, then the dry film resist that is no longer needed is dissolved away, and thus a through electrode 22 is formed in the through via 21. Subsequently, the seed layer is removed at portions that are no longer needed, an outer layer protective film such as the solder resist or the insulating resin is applied as a coating, and thus a second surface wiring layer 23 is formed.

Note that in the present embodiment, the step of forming a through electrode in the through via and forming, on the second surface, a second surface wiring layer that is connected to the first surface wiring layer via the through electrode is referred to as a step D. The step D corresponds to Steps 10, 11 described above, but the disclosure of Steps 10, 11 does not limit the step D.

(Step 12)

Subsequently, the glass carrier 20 temporarily bonded in Step 8 is removed from the glass substrate 11.

(Step 13)

Furthermore, a wiring layer is laminated on the first surface wiring layer 19. At this time, as disclosed in JP 2021-007127 A, for example, an inductor (a coil) can be formed using the through electrode 22, and a thin LC circuit can be formed by combining this inductor with the MIM capacitor. Note that the shape of the inductor is not limited and may be a solenoid or may be spiral, for example.

Figures 4A, 4B:
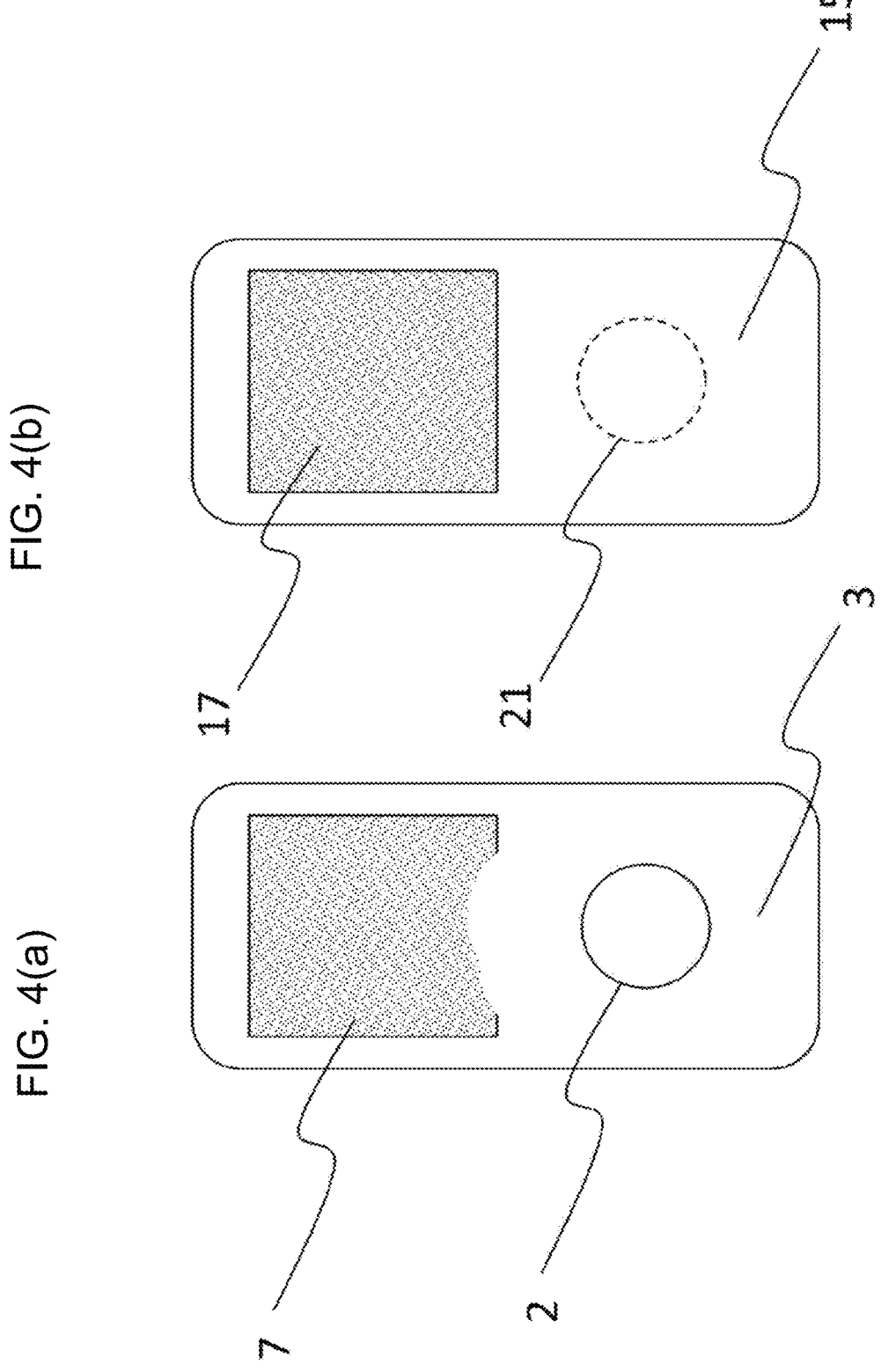
FIG. 4($a$) is a plan view illustrating an example where a through via and a MIM capacitor have been formed on the glass substrate in this order.

FIG. 4(a) is a plan view illustrating an example where the through via 2 and the MIM capacitor have been formed on the glass substrate in this order through the manufacturing process illustrated in FIGS. 1(a)-1(d). FIG. 4(b) is a plan view illustrating an example where the MIM capacitor and the through via 21 have been formed on the glass substrate in this order through the manufacturing process illustrated in FIGS. 2(a)-2(e).

In the example illustrated in FIG. 4(a), an anomaly has been found in the shape of the upper electrode 7 of the MIM capacitor. This shows the effect produced when the dry film resist used to form the upper electrode 7 deforms due to air bubbles BB (FIG. 1). In contrast, in the present embodiment illustrated in FIG. 4(b), the dry film resist does not deform, and the upper electrode 17 of the MIM capacitor that is rectangular as designed can be accurately formed.

Furthermore, according to the present embodiment, the patterning, etc., is performed using the alignment mark AM, and therefore the position, shape, etc., of the lower electrode 15, etc., included in the MIM capacitor can be accurately determined. Thus, variations in the characteristics of the MIM capacitors can be reduced.

Furthermore, according to the present embodiment, since the through via 21 is smaller in diameter on the first surface 11a side than on the second surface 11b' side, the saved space can be used as areas for the wiring, the lower electrode 15, and the like, meaning that the capacitance of the MIM capacitors can be secured, improvements can be made to variations in the characteristics of the MIM capacitors, and the wiring board can be miniaturized.

Furthermore, according to the present embodiment, since the glass carrier 20 is bonded to the first surface wiring layer 19 and the etching process is performed, an accurate process can be performed regardless of the glass substrate 11 being thin. Moreover, the glass carrier 20 is removed after the etching process, and thus a low-profile wiring board can be provided.

Comparison with Comparative Example

Figure 5:
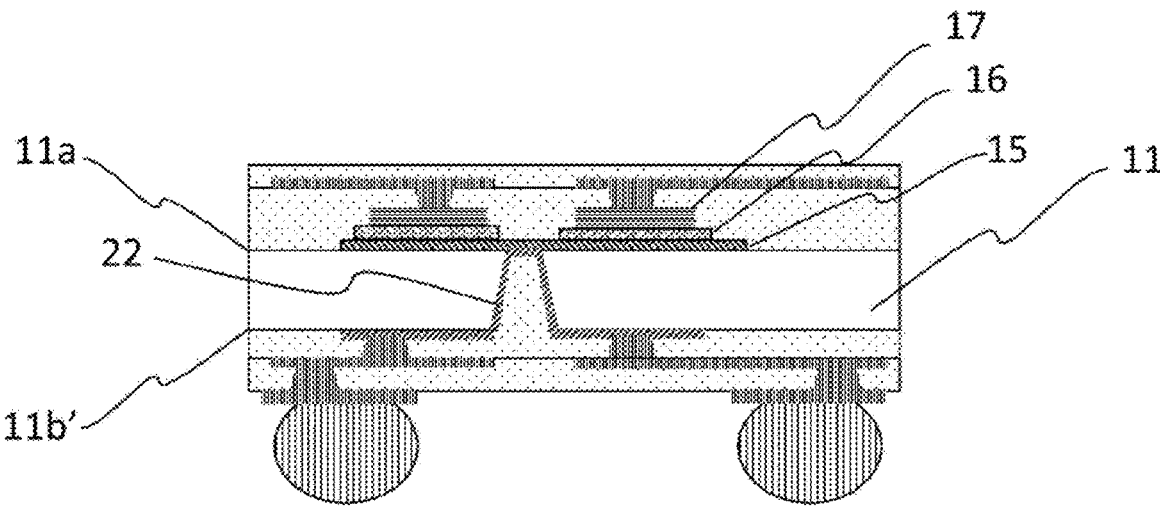
FIG. 5 is a cross-sectional view of a multilayer wiring board (Example 1) formed using the wiring board according to the present embodiment.
Figure 6:
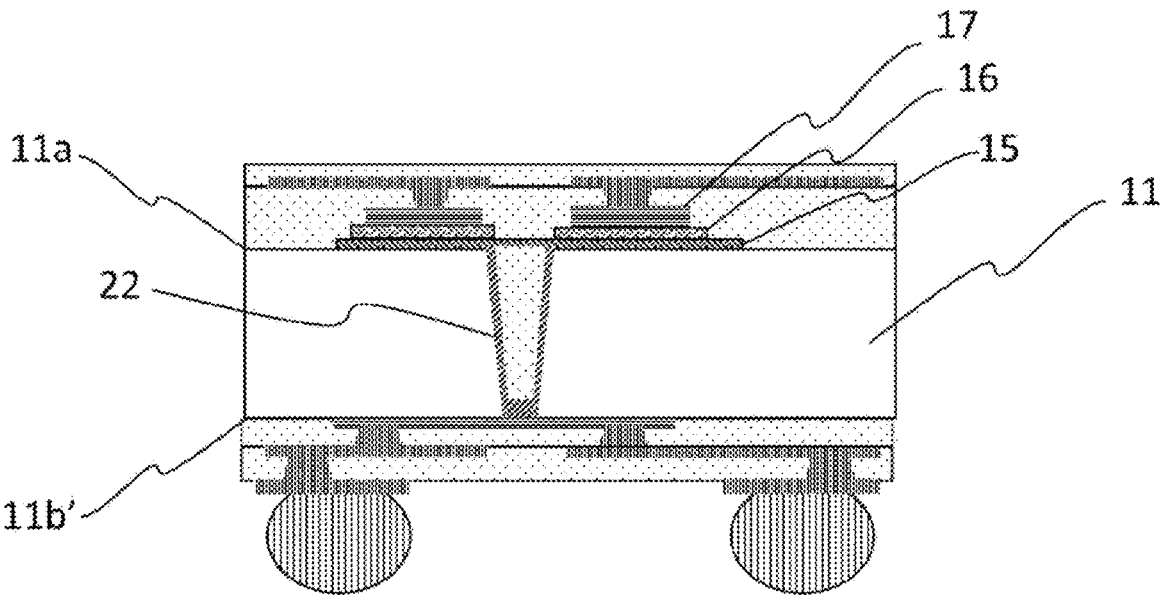
FIG. 6 is a cross-sectional view of a multilayer wiring board (Comparative Example 1) in which the through via has been formed in the first surface of the glass substrate and then the MIM capacitor has been formed on the first surface.
Figure 7:
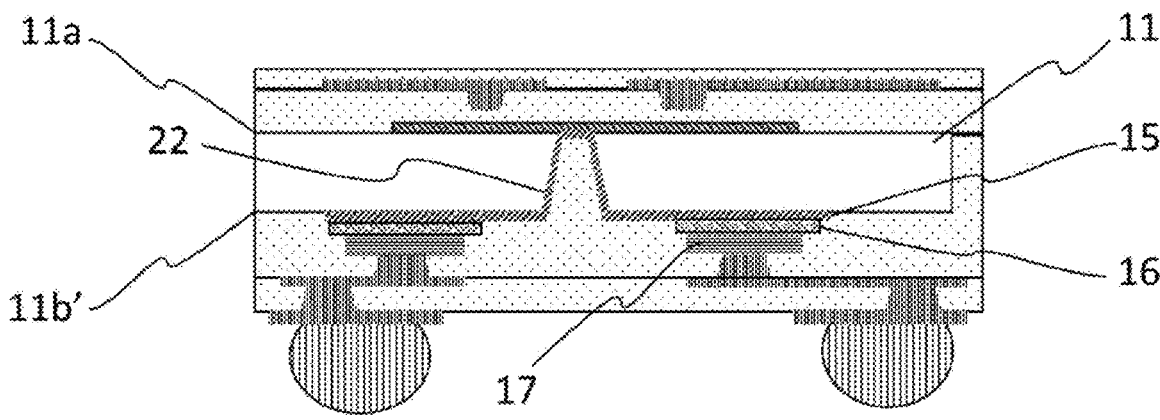
FIG. 7 is a cross-sectional view of a multilayer wiring board (Comparative Example 2) in which the through via has been formed in a second surface of the glass substrate and then the MIM capacitor has been formed on the second surface.

FIG. 5 is a cross-sectional view of a multilayer wiring board (Example 1) formed using the wiring board according to the present embodiment. FIG. 6 is a cross-sectional view of a multilayer wiring board (Comparative Example 1) in which the through via 21 has been formed in the first surface 11a of the glass substrate 11 and then the MIM capacitor has been formed on the first surface 11a. FIG. 7 is a cross-sectional view of a multilayer wiring board (Comparative Example 2) in which the through via 21 has been formed in the second surface 11b' of the glass substrate 11 and then the MIM capacitor has been formed on the second surface 11b'.

The inventors conducted comparison tests regarding the capacitor characteristic and the miniaturization according to Example 1 and Comparative Examples 1 and 2. Table 1 shows the result.

[Table 1]

Figure 8:
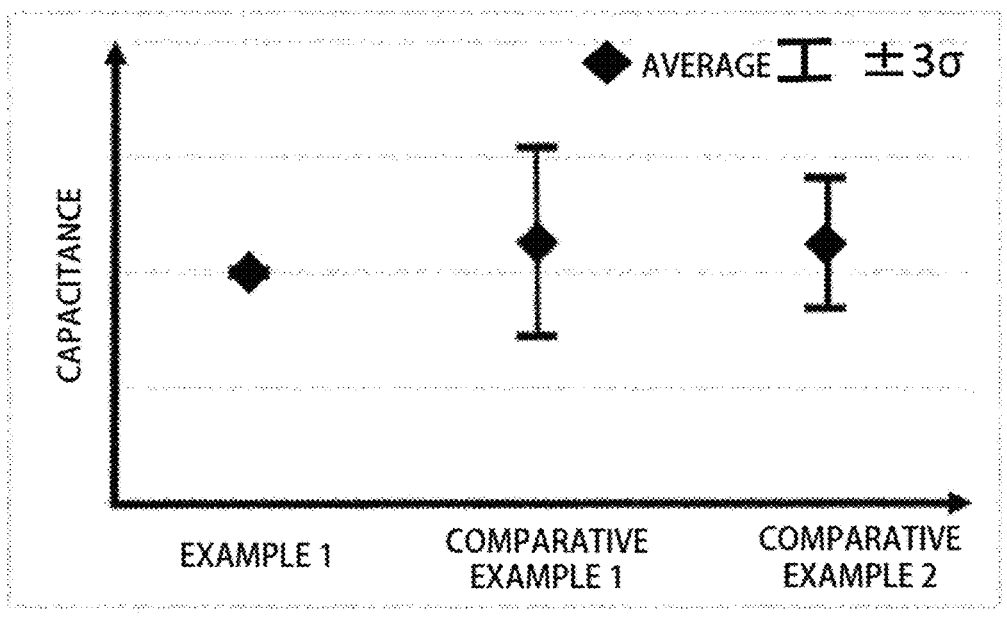
FIG. 8 is a graph indicating calculated variations (±3 σ) in the capacitance of the capacitors according to Example 1 and Comparative Examples 1 and 2.

FIG. 8 is a graph indicating calculated variations in the capacitance of the capacitors according to Example 1 and Comparative Examples 1 and 2. FIG. 8 shows variation in capacitance of the capacitors according to Comparative Examples 1 and 2, and that variation in capacitance of capacitors according to Example 1 is suppressed.

In Table 1, the capacitor characteristics are determined as good (○) when meeting a design capacitance, and are determined as poor (x) when failing to meet the design capacitance. Furthermore, the miniaturization is determined as good (○) when the maximum thickness is less than or equal to 0.2 mm, is determined as fair (Δ) when the maximum thickness is greater than 0.2 mm but less than or equal to 0.4 mm, and is determined as poor (x) when the maximum thickness is greater than 0.4 mm.

As indicated in Table 1, the capacitor characteristic and the miniaturization in Comparative Example 1 are both poor (x). In Comparative Example 2, the capacitor characteristic is poor (x) while the miniaturization is fair (Δ). In contrast, in Example 1, the capacitor characteristic and the miniaturization are both good (○); it was confirmed that the present invention is effective.

REFERENCE SIGNS LIST

11 . . . Glass substrate; 12 . . . Laser-modified portion; 13 . . . Hydrofluoric acid resistant metal film; 14 . . . Copper film; 15 . . . Lower electrode; 16 . . . Dielectric film; 17 . . . Upper electrode; 18 . . . Dry photoresist; 19 . . . First surface wiring layer; 20 . . . Glass carrier; 21 . . . Through via; 22 . . . Through electrode; 23 . . . Second surface wiring layer; 25 . . . Copper layer for wiring.

What is claimed is:

1. A method for manufacturing a wiring board, the method comprising:

applying laser light to a glass substrate from a first surface to an opposite surface of the glass substrate to form a laser-modified portion in the glass substrate, the laser-modified portion extends from the first surface of the glass substrate towards to the opposite surface of the glass substrate perpendicular to the first surface of the glass substrate, the applying further comprises increasing an intensity of the laser light to deform the first surface of the glass substrate into a protrusion or a recess;

forming a first surface wiring layer including a metal-insulator-metal (MIM) capacitor on the first surface of the glass substrate, the MIM capacitor comprises an upper electrode, a lower electrode being closer to the first surface of the glass substrate than the upper electrode and a dielectric film between the upper electrode and the lower electrode, the forming the first surface wiring layer comprises positioning the lower electrode of the MIM capacitor on the first surface of the glass substrate using the protrusion or the recess as a visible alignment mark;

performing an etching process on the opposite surface of the glass substrate to form a through via in the laser-modified portion and form a second surface of the glass substrate opposite to the first surface; and forming a through electrode in the through via and forming, on the second surface, a second surface wiring layer that is connected to the first surface wiring layer via the through electrode.

2. The method of claim 1, wherein further comprising bonding a carrier to the first surface wiring layer before said performing the etching process.

3. The method for manufacturing a wiring board of claim 1, wherein the through via decreases in diameter from the second surface toward the first surface.

4. The method of claim 1, wherein said performing the etching process comprises using a hydrofluoric acid.

* * * * *